(12) United States Patent
Hatfield

(10) Patent No.: US 9,108,577 B2
(45) Date of Patent: Aug. 18, 2015

(54) SPEED LIMITING VEHICLE KEY FOB SYSTEM

(71) Applicant: Michael Luke Hatfield, Saint John (CA)

(72) Inventor: Michael Luke Hatfield, Saint John (CA)

( * ) Notice: Subject to any disclaimer, the term of this patent is extended or adjusted under 35 U.S.C. 154(b) by 0 days.

(21) Appl. No.: 14/146,526

(22) Filed: Jan. 2, 2014

(65) Prior Publication Data

US 2014/0188310 A1    Jul. 3, 2014

Related U.S. Application Data

(60) Provisional application No. 61/748,215, filed on Jan. 2, 2013.

(51) Int. Cl.
*G05D 1/00* (2006.01)
*B60R 16/023* (2006.01)
*G06F 19/00* (2011.01)

(52) U.S. Cl.
CPC .................................. *B60R 16/0231* (2013.01)

(58) Field of Classification Search
USPC ....................................................... 701/2, 70
See application file for complete search history.

(56) References Cited

U.S. PATENT DOCUMENTS

| | | | | |
|---|---|---|---|---|
| 5,485,161 | A  * | 1/1996 | Vaughn | 342/357.31 |
| 6,845,317 | B2 * | 1/2005 | Craine | 701/454 |
| 7,042,347 | B2 * | 5/2006 | Cherouny | 340/439 |
| 7,959,177 | B2 * | 6/2011 | Fiske et al. | 280/271 |
| 8,253,549 | B2 * | 8/2012 | Murray et al. | 340/426.1 |
| 8,258,939 | B2 * | 9/2012 | Miller et al. | 340/457.1 |
| 2012/0280786 | A1 * | 11/2012 | Miller et al. | 340/5.25 |
| 2014/0188310 | A1 * | 7/2014 | Hatfield | 701/2 |

* cited by examiner

*Primary Examiner* — Ian Jen
(74) *Attorney, Agent, or Firm* — Daniel Boudwin; Global Intellectual Property Agency LLC

(57) ABSTRACT

Provided is a preprogrammed key fob system that allows a user to limit a vehicle top speed while the given key fob is being used to operate the vehicle. The system comprises a vehicle system and a navigation system, wherein the navigation system is disposed within the key fobs and the key fob is adapted to communicate with the vehicle system while in use. The navigation system of each key is utilized to capture the local speed limit of a given road, while a vehicle speed is programmed into the specific key to set a vehicle speed buffer above the local speed limit being traveled. The system therefore limits the user of a given key to a preset limit, which adapts in real-time based on the local speed limits and allows the owner of the keys to set the limits and to monitor the vehicle conditions using the system.

11 Claims, 3 Drawing Sheets

SPEED LIMITING VEHICLE KEY FOB SYSTEM

CROSS REFERENCE TO RELATED APPLICATION

This application claims the benefit of U.S. Provisional Application No. 61/748,215 filed on Jan. 2, 2013. The above identified patent application is herein incorporated by reference in its entirety to provide continuity of disclosure.

BACKGROUND OF THE INVENTION

1. Field of the Invention

The present invention relates to automobile keys and means of controlling a vehicle top speed using a programmed key that operates in conjunction with the engine limiter (i.e. a vehicle speed governing means) on the vehicle. More specifically, the present invention relates to a new and improved key or set of key fobs that can be preprogrammed by an administrator to limit the vehicle's top speed when a given key is programmed as such and used by a subordinate (non-administrator) user. The key fobs provide a means to communicate a limit speeding to a vehicle system based on navigation data and a preset buffer for the purposes of improving safety for young drivers and other users. The vehicle speed buffer is preprogrammed by the vehicle owner (i.e. a young driver parent).

Incidences of vehicle accidents and traffic related fatalities tend to be inordinately higher among teen drivers when compared to the population as a whole. This age group is generally the most inexperienced on the road and includes a group that may not have the maturity to handle all driving conditions or realize how to compose oneself while driving in dangerous, or even ordinary driving conditions. These drivers generally lack the experience and know-how related to avoiding dangerous traffic situations as they develop, how to handle a vehicle at speed or in slippery conditions, and also recognizing the limits of the vehicle. It is easy for a young driver to be careless and disregard the energy related with a fast-moving vehicle, and because of this many teen drivers lose control of their vehicles or do not anticipate braking appropriately for the situation. This can lead to collisions and accidents, which can be dangerous and expensive for all involved. Because of this, many parents of teen drivers are often apprehensive about their children driving, particularly when they are first learning.

Two of the larger concerns related to new or young drivers include the ease with which young drivers become distracted, along with the propensity of young drivers to operate their vehicles at excess speeds and above the posted speed limit. Many young drivers do not recognize the true speed of their vehicle or are not accustomed to monitoring their own speed, which can lead to dangerous driving conditions or result in fines from local speed limit enforcement by police. Neither of these situations is a welcomed occurrence for parents of young and new drivers, especially when the solution is merely for the driver to slow down or recognize the local speed zone and obey the posted limit.

Systems exist in the art that allow a vehicle owner to limit the maximum speed at which his or her vehicle can travel. These systems allow the maximum overall vehicle speed to be set and use a vehicle speed governor to prevent speeds in excess of this limit. While controlling the overall maximum speed, these systems do not coordinate with local speed limits and still permit speeding above posted limits below the preset maximum limit. The maximum overall vehicle speed is rarely achievable on most roads and provides little protection in everyday driving environments. Therefore, a need exists for a system that dynamically adapts a maximum speed limit relative to a posted speed limit.

Other systems in the art include those that can determine the maximum speed on a road. These include navigation systems that recognize the vehicle's location using GPS satellites or ground-based antennas (wireless networks) and provide a user with an indication of the speed limit for the given road. These systems are common place on vehicle navigation systems, and provide users with the local speed limit even in the event no local signage is posted. These navigation systems, however, fail to communicate with the vehicle to limit the allowable driving speed and thus are for informative purposes rather than for active speed governing purposes.

The present invention provides a vehicle speed limiting system that incorporates a dynamic, real-time updating vehicle speed limit that is preprogrammed to an ignition key fob. The vehicle speed limit set to the key fob is one that adapts to the posted road speed limit. Rather than providing an overall maximum vehicle speed, the system utilizes navigation data streaming wirelessly into the system to first determine the local speed zone and then update the allowable vehicle speed based on the determined local speed zone. The administrator of the system programs the key fob to a given allowable speed limit above the local speed zone (i.e. a speed buffer), wherein the system prevents the vehicle from achieving a vehicle speed in excess of this allowable speed limit plus the local speed zone. Overall, the system updates its maximum allowable speed limit to one in relation to the local speed zone, providing a more effective means to prevent speeding and one that can intervene more often than a single maximum vehicle speed.

2. Description of the Prior Art

Devices have been disclosed in the prior art that relate to vehicle speed limiters and systems therefor. These include systems that have been patented and published in patent application publications related to speed governors, systems that limit the maximum overall speed of the vehicle, and those that relate to navigation systems that provide local speed limit information to a driver. The following is a list of devices deemed most relevant to the present disclosure, which are herein described for the purposes of highlighting and differentiating the unique aspects of the present invention, and further highlighting the drawbacks existing in the prior art.

One such device in the prior art is U.S. Pat. No. 7,959,177 to Fiske, which discloses a programmable device that interfaces with a motor vehicle that is adapted to identify the driver and to limit the maximum speed of the vehicle. The device comprises an ignition key that communicates with the vehicle's onboard computer to place an upper limit on the maximum speed allowable by the vehicle while that key is used with the vehicle. The ignition key includes a computer chip that may be programmable by the administrator to set the maximum allowable speed. The Fiske system is quite similar to the present invention, however it fails to incorporate a means of determining the local speed zone in which the vehicle is currently operating, and merely sets an upper limit to the speed of the vehicle. The present invention monitors the local speed zones and provides a system that adapts an upper limit above the local speed based on the ignition key deployed and the programmed settings. The maximum allowable speed is in reference to the speed limit, so speeding in general is regulated, not simply maximum vehicle speed. The maximum vehicle speed is not as large of a concern and is not a threshold as often crossed by a vehicle user as is traveling above a local speed limit.

Another prior art device is U.S. Pat. No. 7,042,347 to Cherouny, which discloses a system for regulating the performance of a vehicle based on the individual in use of the vehicle and based on his or her past history related to traffic violations, accidents, and driver skill level. The system includes a preprogrammed data processing means, a wireless transmitting means to send location and speed data to a central server, and an engine control means. The vehicle is monitored by the central server in real-time and the vehicle's performance and maximum allowable speed can be adjusted based on the driver's actions and outside conditions (e.g. rain, nightfall, etc.). The Cherouny, like the Fiske invention, relates to governing a vehicle speed; however the Cherouny device does not contemplate use of a programmable key and a system that updates the governed speed based on the local speed limits the vehicle is traveling through in real-time. The present invention updates the allowable threshold speed at a percentage or a given speed buffer above the speed limit, wherein the system coordinates with GPS to determine the local speed limits.

U.S. Pat. No. 8,253,549 to Murray discloses a system for communicating over a wireless network with a vehicle for monitoring aspects of a vehicle's operation from a remote site using a cellular mobile radiotelephone network. The system monitors a vehicle's speed while in operation and tracks the periods in which a speed threshold value is exceeded. A transceiver sends a message indicating that the speed of the vehicle exceeds the speed threshold value, where additional messages are sent until the speed of the vehicle reduces to an amount that is a percentage below the speed threshold value. The Murray device is suitable for alerting drivers and administrators to monitor a vehicle speed and send indicators to the driver or others of the vehicle state, with the goal of prompting the driver to reduce his or her speed. The system of Murray does not contemplate a governor that is continually updated based on local speed limits, as provided herein.

U.S. Pat. No. 8,258,939 to Miller discloses a system for controlling one or more vehicle features based on the driver status and the key employed while operating the vehicle. The driver status is determined based on the ignition key deployed, which determines the control of the vehicle functionality while in operating. The designated primary driver has greater control of the selectable features of the vehicle than does the secondary driver, wherein young or inexperienced drivers can be designated as secondary drivers. The controllable functions include stability control, lane departure warnings, and other safety features that may be turned off by the primary driver but not by the secondary driver. The Miller device, therefore, denies full access to the features of a vehicle depending on the ignition key utilized to operate the vehicle, wherein safety features cannot be deactivated without the primary driver's permission. The Miller device does not contemplate speed controls relative to local speed zone limits.

Finally, U.S. Pat. No. 5,485,161 to Vaughn and U.S. Pat. No. 6,845,317 to Craine both disclose systems for monitoring the speed of a vehicle using navigation data and comparing the speed of the vehicle to locally posted speed limits. These devices contemplate adjusting the vehicle speed based on the posted speed limit in Vaughn, and to alerting the driver through a dashboard illuminator in Craine. These systems, while providing a system that uses navigation data over a wireless network (e.g. GPS, cellular network, etc.), do not include a specific key that uses the navigation data to apply to a given secondary user. The present invention uses a master and slave keys, wherein the slave keys are preprogrammed to limit the vehicle speed based on the local speed limit, while the master key can be programmed as the vehicle owner would prefer. The present invention offers a combined system that allows parents and vehicle owners to control the operation of their vehicle (for teenage drivers or during valet service, etc.), wherein a specific key triggers the limited speed of the vehicle, as compared to the local speed limits.

The present invention provides a new and improved vehicle speed limiting means that utilizes a preprogrammed key fob that functions in coordination with a vehicle system and a navigation system imbedded in the key fob itself to limit the vehicle's maximum allowable speed. The maximum vehicle speed is equal a preset buffer above the local speed limit in which the vehicle is traveling. The preset speed buffer is controlled by the vehicle owner or system administrator, and functions only when a preprogrammed slave key fob is used with the vehicle. A master key fob can be programmed without any such limitations on speed. Overall, the present invention provides a means to dynamically control the vehicle maximum speed to prevent excessive vehicle speeding for both young and adult drivers. Contemplated uses include teen drivers, for non-vehicle owners, for those with excessive speeding violations, or for limiting the speed of the vehicle during a valet service.

It is submitted that the present invention is substantially divergent in design elements from the prior art, and consequently it is clear that there is a need in the art for an improvement to existing vehicle speed limiting systems. In this regard the instant invention substantially fulfills these needs.

SUMMARY OF THE INVENTION

In view of the foregoing disadvantages inherent in the known types of vehicle speed limiting systems now present in the prior art, the present invention provides a new system for providing convenience for the user when preventing a vehicle from speeding above a local speed zone limit based on a predefined limitation, navigation data, and based on the ignition key deployed on the vehicle at any given time.

It is therefore an object of the present invention to provide a new and improved vehicle speed limiting system that has all of the advantages of the prior art and none of the disadvantages.

It is another object of the present invention to provide a vehicle speed limiting system that utilizes a preprogrammed ignition key or key fob, wherein the key fob communicates to the system what type of user is driving the vehicle and what the preset speed limit is relating to that driver.

Another object of the present invention is to provide a vehicle speed limiting system that utilizes a master and slave key fob, wherein several slave keys can be programmed for specific users, and master key fobs can be programmed or unprogrammed for unlimited vehicle use.

Yet another object of the present invention is to provide a vehicle speed limiting system that utilizes navigation data from a GPS satellite connection or ground-based data to determine the road being traveled and the identified speed limit thereon, wherein the vehicle speed upper limit is dynamic and changes based on the road traveled and gaps in the incoming data can make the system default to an overall upper limit in vehicle speed.

Another object of the present invention is to provide a vehicle speed limiting system that coordinates with a vehicle engine management system or engine computer (i.e. the vehicle system) to govern the speed limit of the vehicle during operation, wherein several different means of limiting the vehicle speed maximum are contemplated and well known in the art.

Another object of the present invention is to provide a vehicle speed limiting system that uses a key having a navigation system and means of communicating with a vehicle system imbedded therein, wherein the key communicates the speed limit to the vehicle system along with the preset speed buffer thereabove and the vehicle system sets the maximum vehicle speed based on the received values.

Another object of the present invention is to provide a vehicle speed limiting system that allows an administrator to monitor the vehicle speeds and conditions over time and track the vehicle usage for both slave and master key fob users.

Other objects, features and advantages of the present invention will become apparent from the following detailed description taken in conjunction with the accompanying drawings.

BRIEF DESCRIPTIONS OF THE DRAWINGS

Although the characteristic features of this invention will be particularly pointed out in the claims, the invention itself and manner in which it may be made and used may be better understood after a review of the following description, taken in connection with the accompanying drawings wherein like numeral annotations are provided throughout.

DETAILED DESCRIPTION OF THE INVENTION

Figure 1:
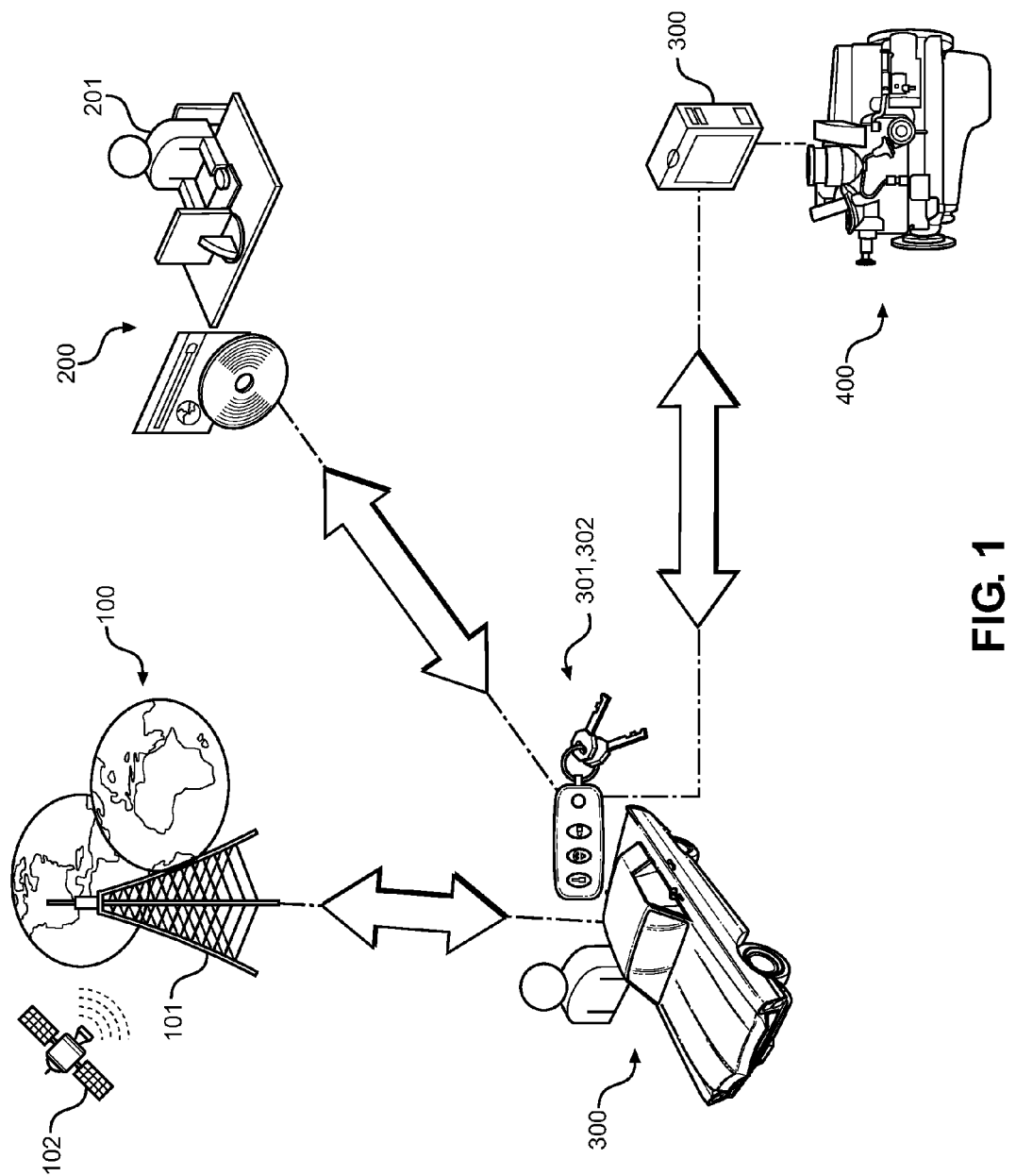
FIG. 1 shows a pictorial system view of the vehicle speed limiting system of the present invention, wherein the system comprises a set of key fobs includes preprogrammed data, a means of receiving navigation data, and a means of communicating with a vehicle system.

Reference is made herein to the attached drawings. Like reference numerals are used throughout the drawings to depict like or similar elements of the vehicle speed limiting system. For the purposes of presenting a brief and clear description of the present invention, the preferred embodiment will be discussed as used for limiting a vehicle speed relative to local speed limits and applying the limitation using a preprogrammed key that interfaces with a vehicle system adapted to register navigation data and limit the vehicle speed based on the preprogrammed key fob data and the navigation data. The figures are intended for representative purposes only and should not be considered to be limiting in any respect.

Referring now to FIG. 1, there is shown a view of the system from a high level, in which the major elements of the present invention are highlighted and their interaction. The systems of the present invention provide a means of controlling the top speed of a vehicle based on the given driver and the local speed limit in which the vehicle is currently traveling. The system updates the maximum allowable vehicle speed in real-time and based on the local speed limit, wherein a preset buffer above the speed limit allows for a set allowable speed above the local limit for emergency purposes and to allow the vehicle to conceivably maintain the same speed as the other vehicles on the road and maintain a flow of traffic speed. The goal is to limit non-vehicle owners, inexperienced drivers, or habitual speeders from operating a vehicle in excess of local speed limits with an owner's vehicle.

The vehicle speed limiting system of the present invention comprises a set of ignition keys 301, 302, or key fobs that are adapted to be programmed and keyed for a given vehicle 300. Vehicle specific keys are customary for all vehicles, wherein the vehicle ignition is unique to a set of keys and the owner is given several keys for multiple user operation thereof. The present invention contemplates keys having a programmable processing means or computer chip therein that communicates with a vehicle system such that the vehicle can recognize and distinguish each of the different keys from the set. The present invention contemplates at least one master key 301 and at least one slave key 302. These keys may use short range wireless technology for communication with the vehicle, or alternatively comprise physical connection with the vehicle ignition.

The keys of the present invention are programmed by an administrator 201 using a computer interface or program with a graphic user interface on a personal computer 200. The slave key 302 is paired or otherwise connected to the computer and the program 200 is used to program the features of the key 302 prior to its use, wherein certain parameters of the system can be set on the key 302. These parameters include setting a buffer speed limit above a calculated local speed limit in which the vehicle operating when the vehicle is operated with the given key. Generally a limit is defined as a set number of miles per hour above the local speed limit (e.g. five miles per hour or ten miles per hour above the calculated local speed limit). Once programmed and once the key 302 is used with the vehicle, the vehicle will not allow the vehicle to achieve a speed in excess of the preprogrammed buffer speed plus the local speed limit. The vehicle overall maximum speed is therefore dependent upon the local speed and the preprogrammed speed, rather than dependent on a single, static maximum vehicle speed.

The vehicle system 300 is one that comprises a means of communicating with the key fob to acquire its identification and to determine the preprogrammed speed buffer programmed thereon, along with a means of governing the vehicle engine 400. A vehicle speed governing means 401 is utilized to limit the engine 400 speed to the set programmed limit as interpreted by the vehicle system from the key fob 302 and updated in real-time, wherein the user cannot surpass this allowable speed while using the programmed slave key 302. The master keys 301 are those that are not speed limited.

To determine the local speed limit, the key fobs of the present invention incorporate a navigation system to receive navigation data while the vehicle is in use. Navigation systems are well known in the art for providing local speed limits as the vehicle travels along a known road. The present invention contemplates a navigation system 100 imbedded within the key fobs, wherein GPS satellite 102 data and ground-based 101 data are utilized to determine the road upon which the vehicle is traveling and the known speed limit posted thereon. This limit is utilized in the calculated speed limit of the vehicle in conjunction within the preprogrammed speed buffer for the given key. In instances in which the local road is not known or the speed is not known, a default upper limit may be defined such that the vehicle is not unreasonably limited.

Figure 2:
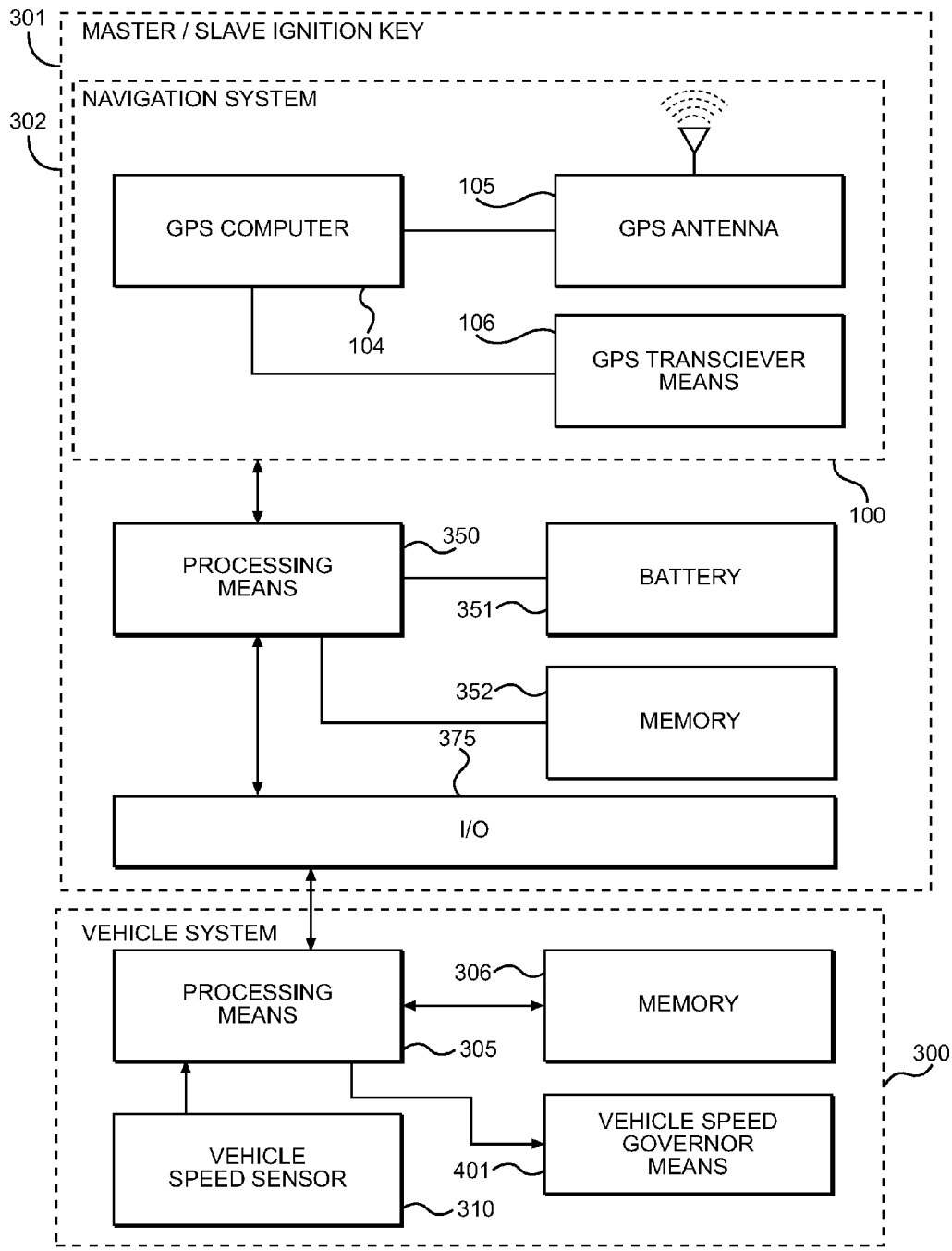
FIG. 2 shows a view of the navigation system imbedded within the key fob of the present invention and the vehicle system elements of the present invention.

Referring now to FIG. 2, there is shown a system view of the major elements of the present invention: the navigation system 100 within the key fob, the vehicle system 300, and the system elements of the programmable ignition keys 301, 302. The vehicle system 300 is one that can be added to an existing vehicle or provided as original equipment from a manufacturer. The vehicle system comprises a processing means 305, a computer memory 306, a vehicle speed sensor means 310, and a vehicle speed governing means 401. The processing means 305 comprises the vehicle's engine control unit (ECU) or a separate processor (CPU, microprocessor, etc.) that communicates with the vehicle ECU and coordinates with the key fob 302/301 of the present invention. The processing means 305 interprets signals from the vehicle speed sensor 310, determines the type of key deployed and translate the preprogrammed data from the keys 301/302, interacts with the computer memory 306 (e.g. computer RAM, etc.), and then communicates the maximum allowable speed to the vehicle speed governing means 401. The vehicle speed governing means 401 may take on different forms based on the type of vehicle and the technology preferred to control the engine. Most modern passenger vehicle engine governors utilize an electronic governor that limits the throttle of the vehicle based on vehicle speed or ceases the fuel injectors when a threshold speed is approached. The present invention is adapted to function with currently known electronic engine governors known in the art, wherein the vehicle system of the present invention determines the vehicle maximum in real-time and updates the governor based on the sampling rate of the system.

The master ignition key and said slave ignition keys are preferably electronic keys that comprise a communication means (input/output) 375 that is adapted to communicate the preprogrammed speed buffer of the key and the key identification to the vehicle system. The key I/O 375 can make a physical connection with the vehicle system or preferably the keys comprise a wireless communication means for communicating with the vehicle system. When preprogramming the keys, it is contemplated that the keys can be physically connected to a personal computer (i.e. using a dongle), or alternatively a wireless connection means is provided (i.e. short range wireless transceiver, etc.). Each of the keys is programmed using a program on a personal computer to set the speed buffer and to identify the key a slave or master key.

Each of the keys 301/302 includes a microprocessor or similar processing means 350, a rechargeable battery 351, and computer memory in order to coordinate functions between the vehicle system 300 and the imbedded navigation system 100. Computer storage may also be incorporated into the key fobs for storing data from the navigation system 100 or storing code and data thereon.

The navigation system 100 of the present invention is one that is adapted to communicate with satellite based GPS systems and/or ground-based GPS systems to acquire data to first locate the vehicle on a map, and then recognize the local speed limit. The navigation system 100 of the present invention comprises a GPS computer 104 that interfaces with a GPS satellite antenna 105 and a GPS transmitting and receiving means 106. The GPS antenna 105 communicates with GPS satellites and the GPS transmitting and receiving means 106 communicates with ground-based GPS systems to locate the vehicle and to determine the local speed limit.

Figure 3:
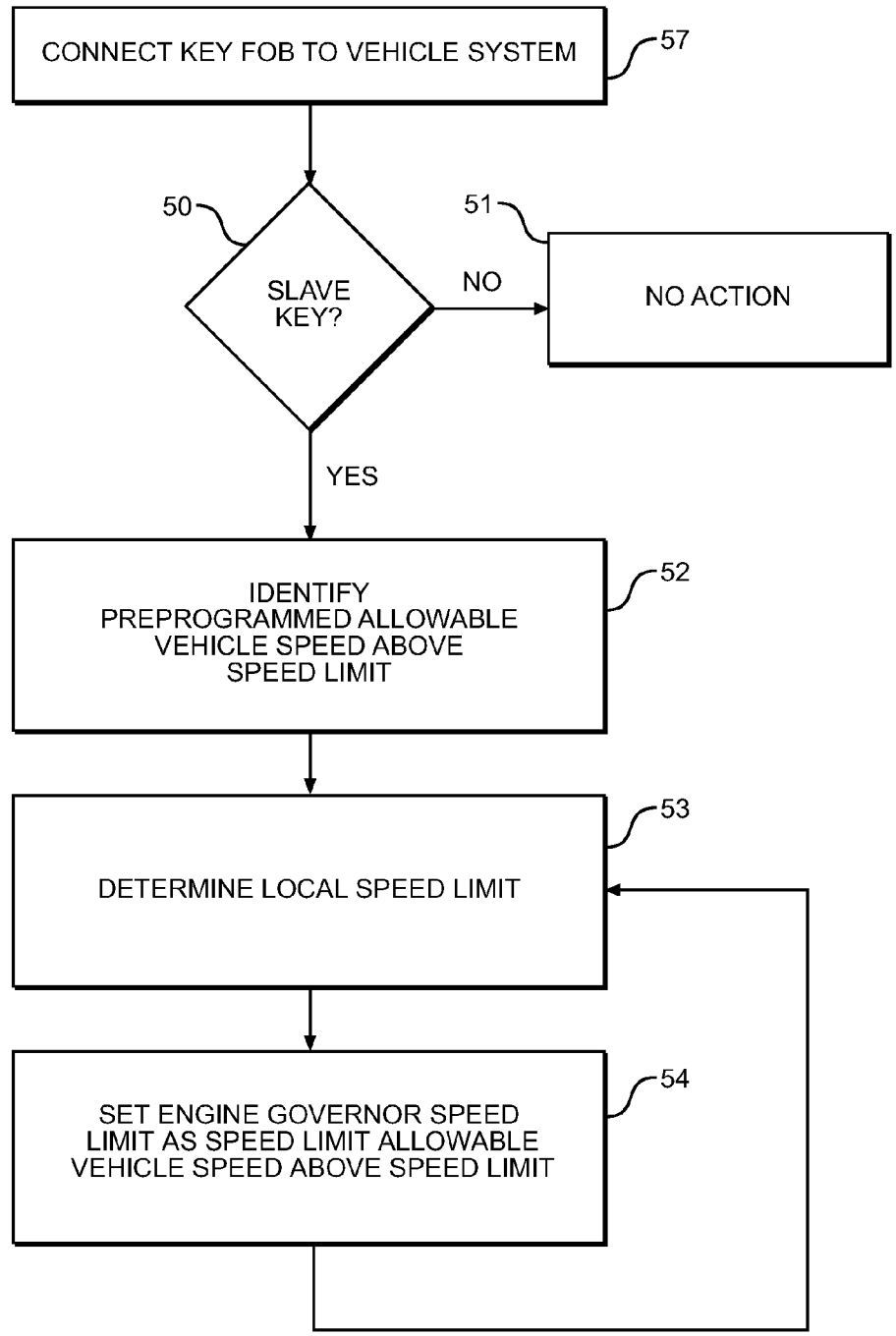
FIG. 3 shows a high level representation of the contemplated algorithm for maintaining a maximum speed limit relative to local speed limits for a given preprogrammed slave key.

Referring now to FIG. 3, there is shown a high level view of the programmed logic of the vehicle system, which first observes 57 a connection with a key fob of the present invention and then determines 50 the type of key being deployed. The vehicle system first recognizes 57 the vehicle key to determine if a slave key is deployed 50. If a master key is deployed, no action is necessary and the vehicle operates uninhibited. If a slave key is used, the system communicates with the key to identify 52 the preprogrammed allowable vehicle speed above the local speed limit. The slave key and master key are determined based on an electronic identification means. This comprises a wireless signal sent to the vehicle system or a physical key that is unique to the slave key fob that alerts the vehicle system of the slave key presence. Once the speed buffer is determined from the slave key, the vehicle system communicates in real-time with the navigation system of the key to determine 53 the local speed limit of the road in which the vehicle is being driven upon. Once the local speed limit is known, the vehicle system sets 54 the engine governor means to the local speed limit plus the buffer speed preprogrammed on the key. The local speed limit 53 is determined on a real-time basis, wherein the speed limit of the road is reevaluated based on the sampling frequency of the system. For intersections in which the vehicle may need to accelerate from one local speed to another during a transition between roads, it is contemplated that the system will monitor ahead of the vehicle and set the speed limit to the maximum speed limit of the choosable roads ahead of the intersection. The engine governor means is updated at an equivalent or reasonably equivalent frequency as the navigation data is received regarding the local speed limits. Therefore, the vehicle speed limit is updated continuously and in real-time.

Overall, the present invention provides a system for governing the maximum allowable speed of a vehicle relative to the local speed limit. The system comprises allows the administrator of the system to program a slave electronic key to allow a vehicle to operate at a certain speed in relation to the speed limit on a given road. The navigation system determines the allowable speed on the given road, which is in turn used to set the maximum operational speed that the vehicle can travel. This provides vehicle owners with a means of setting a maximum vehicle speed threshold for young drivers, those with speeding habits, and for situations in which a non-owner is using the car (valet, friends borrowing car, etc.). It is further contemplated that the system can track the location and metrics of the vehicle over a period of time when in use with a slave key. The administrator can record and interrogate a detailed report of a driving log for all slave key operators. This further adds a level of security for vehicle owners and administrators when the vehicle is in-use by another.

It is submitted that the instant invention has been shown and described in what is considered to be the most practical and preferred embodiments. It is recognized, however, that departures may be made within the scope of the invention and that obvious modifications will occur to a person skilled in the art. With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

I claim:

1. A vehicle speed limiting system, comprising:
   a vehicle system adapted to be installed on a vehicle, said vehicle system comprising:
     a processing means;
     a memory;
     a vehicle speed sensor;
     a vehicle speed governing means;
   at least one master ignition key;

at least one slave ignition key;

said slave ignition key further comprising a programmable chip and a memory adapted to store a preprogrammed speed buffer, a battery power supply, and an electronic identification of said key as a master ignition key or a slave ignition key;

said slave ignition key further comprising a communication means for communicating said preprogrammed speed buffer and said electronic identification to said vehicle system;

said slave ignition key further comprising a navigation system adapted to determine said vehicle system location and a local speed limit at said vehicle system location.

2. The vehicle speed limiting system of claim 1, wherein said navigation system further comprises:

a GPS computer;

a GPS antenna.

3. The vehicle speed limiting system of claim 1, wherein said navigation system further comprises:

a GPS computer;

a GPS transmitting and receiving means.

4. The vehicle speed limiting system of claim 1, wherein said slave ignition key further comprises:

a connection means between said slave ignition key and a personal computer for preprogramming said slave ignition key.

5. The vehicle speed limiting system of claim 1, wherein said master ignition key further comprises:

a connection means between said master ignition key and a personal computer for preprogramming said master ignition key.

6. The vehicle speed limiting system of claim 1, wherein:

said master ignition key further comprising a programmable chip and a memory adapted to store a preprogrammed speed buffer, a battery power supply, and an electronic identification of said key as a master ignition key or a slave ignition key;

said master ignition key further comprising a communication means for communicating said preprogrammed speed buffer and said electronic identification to said vehicle system;

said master ignition key further comprising a navigation system adapted to determine said vehicle system location and a local speed limit at said vehicle system location.

7. The vehicle speed limiting system of claim 1, wherein said battery power supply is rechargeable.

8. The vehicle speed limiting system of claim 1, wherein said electronic identification further comprises a physical connection between said vehicle system and said slave key.

9. The vehicle speed limiting system of claim 1, wherein said electronic identification further comprises a wireless connection between said vehicle system and said slave key.

10. The vehicle speed limiting system of claim 6, wherein said electronic identification further comprises a physical connection between said vehicle system and said master key.

11. The vehicle speed limiting system of claim 6, wherein said electronic identification further comprises a wireless connection between said vehicle system and said master key.

* * * * *